US006384478B1

(12) United States Patent
Pour (10) Patent No.: US 6,384,478 B1
(45) Date of Patent: May 7, 2002

(54) LEADFRAME HAVING A PADDLE WITH AN ISOLATED AREA

(75) Inventor: Siamak Fazel Pour, Irvine, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/073,779

(22) Filed: May 6, 1998

(51) Int. Cl.$^7$ ............................................... H01L 23/34
(52) U.S. Cl. ..................... 257/724; 257/667; 257/669; 257/676; 257/709; 257/725; 257/788; 257/796
(58) Field of Search ............................ 257/667, 669, 257/676, 709, 724, 725, 788, 796

(56) References Cited

U.S. PATENT DOCUMENTS

| 5,103,283 A | | 4/1992 | Hite | |
|---|---|---|---|---|
| 5,294,867 A | * | 3/1994 | Notani et al. | 333/33 |
| 5,428,245 A | * | 6/1995 | Lin et al. | 257/666 |
| 5,442,228 A | | 8/1995 | Pham et al. | |
| 5,504,370 A | * | 4/1996 | Lin et al. | 257/676 |
| 5,508,556 A | * | 4/1996 | Lin | 257/691 |
| 6,034,423 A | * | 2/2000 | Mostafazadeh et al. | 257/691 |

FOREIGN PATENT DOCUMENTS

WO    WO 96 08842    3/1996

OTHER PUBLICATIONS

Patent Abstracts of Japan, vol. 096, No. 004, Apr. 30, 1996 & JP 07 321069 A (NEC Corp.) Dec. 8, 1995.
Patent Abstracts of Japan, vol. 015, No. 405, Oct. 16, 1991 & JP 03 166756 A (Seiko Epson Corp.) Jul. 18, 1991.
Patent Abstracts of Japan, vol. 018, No. 617, Nov. 24, 1994 & JP 06 236959 A (Ibiden Co. Ltd.) Aug. 23, 1994.
Walter Marton, Ansgar Pottbäcker, "Coil in Leadframe," IEEE Workshop on Chip Package Co–Design CPD '98, ETH Zurich, Switzerland, Mar. 24, 1998.

* cited by examiner

Primary Examiner—Eddie Lee
Assistant Examiner—Matthew E. Warren
(74) Attorney, Agent, or Firm—Thomas, Kayden, Horstmeyer & Risley (57) ABSTRACT

A package is provided for surface mounting a semiconductor device to a board such that a first pad of the semiconductor device is operatively connected to a second pad on the board. The package includes a paddle having a front side and a back side with the front side being mated to the semiconductor device and at least partially enclosed in an encapsulant material and the backside being substantially exposed. In addition, the package has a region of the paddle that is at least partially isolated by the encapsulant material and aligned with the second pad an interconnect connected to the first pad of the semiconductor device and bonded to the region such that a conductive path is formed with the first pad, the region and the second pad when the backside is mated with the board.

11 Claims, 6 Drawing Sheets

LEADFRAME HAVING A PADDLE WITH AN ISOLATED AREA

BACKGROUND OF THE INVENTION

1. Field of the Invention

The present invention generally relates to semiconductor packaging, and more particularly to a leadframe having a paddle area containing an electrically isolated region.

2. Description of Related Art

The electronics industry has continued to make significant advances in microelectronics technology. These advances are producing silicon-based integrated circuits with increased circuit density and a corresponding rise in the rate at which functions are performed. However, as circuit density and speed are improved, corresponding progress must be made with the structures that carry the device and provide the input/output (I/O) interconnections.

The structure that carries a semiconductor device and provides the necessary I/O interconnections is generally referred to as the package. A typical microelectronic package is designed to provide a structure to support and protect the device and a means by which to distribute circuit generated heat. Furthermore, the package provides connections for signal lines leading onto and out of the silicon chip, connections that present varying potentials for power and ground, and a wiring structure for I/O signal interconnections within a system. These connections must be made at each level of the packaging hierarchy and as this hierarchy is traversed (i.e., from the chip to the I/O components), connection scaling must be provided because the circuits and connections (i.e., wire lines) continue to increase in size. At the first level of the hierarchy (i.e., chip to substrate), this scaling is usually provided by the leadframe.

Figure 1:
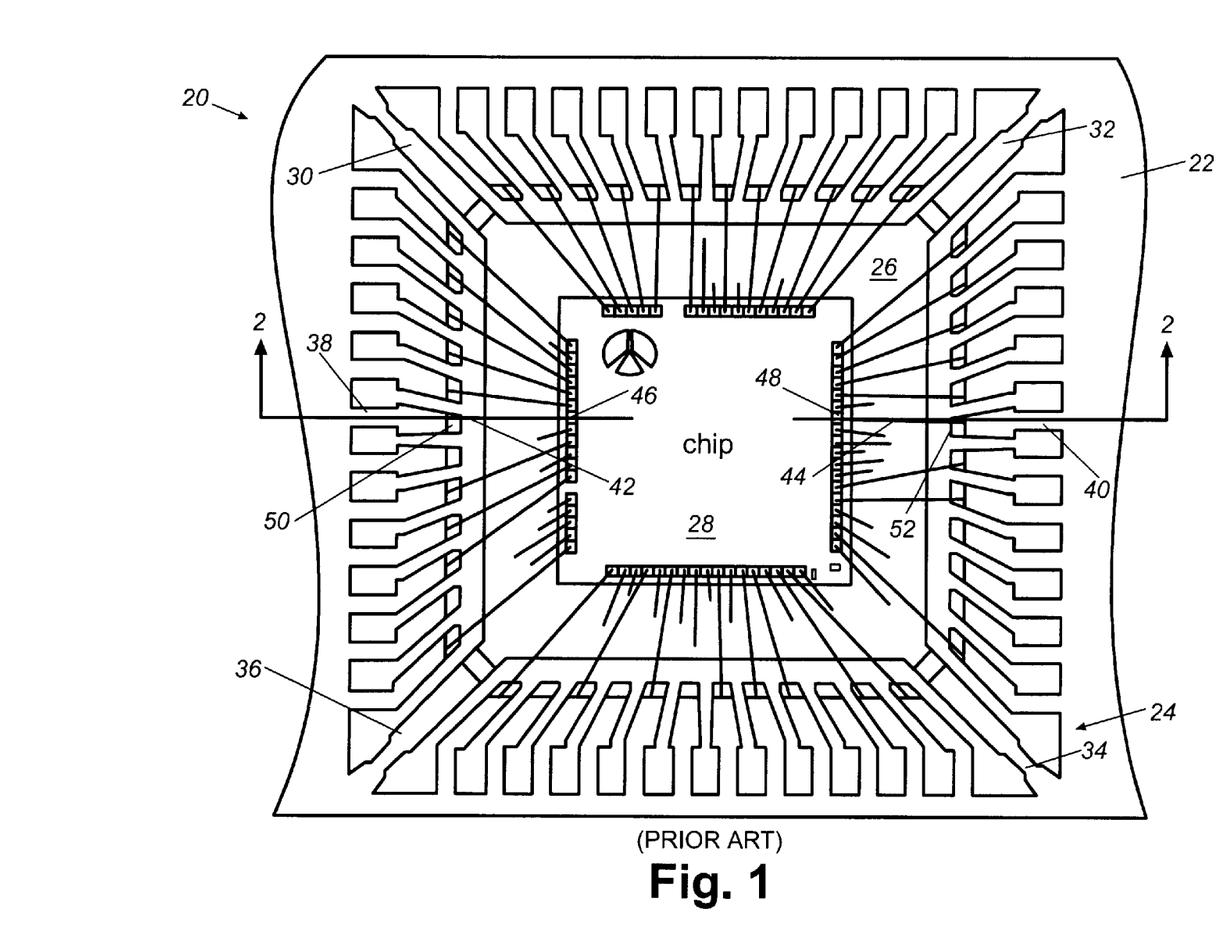
FIG. 1 is a plan view of a prior art leadframe.
Figure 2:
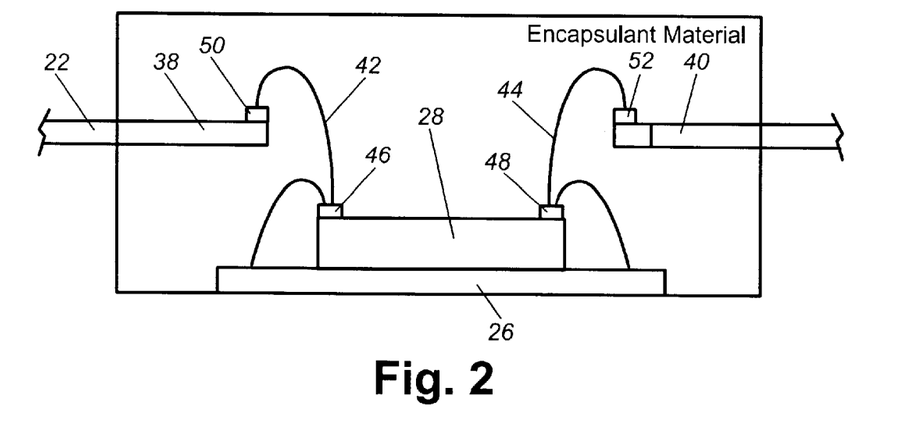
FIG. 2 is a cross-sectional view of the prior art leadframe of FIG. 1 taken along lines 2—2.

A plan view of a conventional leadframe 20 is shown in FIG. 1 and a cross-sectional view of the leadframe 20 taken along lines 2—2 of FIG. 1 is presented in FIG. 2. Referring to FIG. 1 and FIG. 2, the leadframe 20 has a leadframe body 22 that contains a die-mounting structure 24. The die-mounting structure 24 is typically formed through an etching or stamping process and the leadframe is usually made of a metal, such as copper (Cu) or a metal alloy.

The die-mounting structure 24 has a square die-pad or paddle 26 for receiving a semiconductor chip 28 that may be adhesively or metallurgically bonded thereon and four structural supports 30,32,34,36. Each of the structural supports 30,32,34,36 extend from a corresponding corner of the paddle 26 so that the paddle 26 is mechanically connected to the leadframe body 22.

The die-mounting structure also has numerous leads 38,40 that provide the scaled connections from the chip 28 to the next level of the package. The leads 38,40 are commonly connected to the chip 28 using a process called wire bonding. This process consists of attaching flexible wires 42,44 from the chip bonding pads 46,48 to the lead posts 50,52, or alternatively, from the chip bonding pads 46,48 to the paddle 26.

Currently, 25% to 40% of the leads are assigned to different ground and power supply nets. Therefore, power supply and ground contacts have a major contribution to package cost, size, and performance. Furthermore, path inductance from the chip to the outside of the package, which is directly proportional to the path length from the bond pads of the chip to the bond pads of the leads, continues to negatively impact chip performance, especially for digital/mixed signal and Radio Frequency (RF) chips.

While a leadframe based package with a low inductive path is currently available in a deep down-set paddle package, only a single low inductive path is provided and typically used for ground.

An additional packaging limitation is the inability to effectively integrate high Q inductors. As inductors with values ranging from 1.5 nH to 15 nH and having a Q greater than 20 are used in Voltage Controlled Oscillators (VCO), input and output matching of Low Noise Amplifiers (LNA), output matching RF circuit mixers, and gain adjustment circuits, integration of high Q inductors into a microelectronic package is highly desirable. However, the current practice of using on-chip inductors fails to provide an adequate solution.

On-chip inductors are usually limited to low Q values (i.e., typically less than 5). Furthermore, on-chip inductors tend to couple noise through the substrate. In addition, creation of on-chip inductors requires a thick metal layer (i.e., usually greater than 2 microns) which consumes a significant area of the chip and reduces chip yield while increasing chip cost. Therefore, an off-chip inductor would be preferable if a high Q was provided and the overall size of the microelectronic package was not significantly increased.

In view of the foregoing, it is an object of the present invention to provide a leadframe that reduces the number of leads required for power supply and ground contacts, thereby reducing package cost, size, and performance. It is a further object of the present invention to reduce the path inductance from the semiconductor device to the outside of the package for power supply, ground and I/O interconnections, especially for high speed signals that have data rates of at least one gigabit/second. In addition, it is an object of the present invention to provide an off-chip inductor having a high Q without significantly increasing the overall size of the package. Furthermore, additional advantages and features of the present invention will become apparent from the subsequent description and claims taken in conjunction with the accompanying drawings.

SUMMARY OF THE INVENTION

A leadframe for a semiconductor device is provided that includes a leadframe body and a paddle area within the leadframe body for mounting the semiconductor device thereon. The leadframe also has an electrically isolated region within the paddle area.

A method of forming an isolated region in a paddle of a leadframe is provided that includes defining a first region within the paddle and a second region within the leadframe with the first region demarcating the isolated region within the paddle and the second region designating a support region of the isolated region. The method also has the steps of removing base material of the paddle that is adjacent to the first region such that a gap is formed around a substantial portion of the first region and the second region remains at least partially connected to said first region. The second region is disconnected from the first region such that the first region is isolated from the second region and isolated within the paddle.

Additional advantages and features of the present invention will become apparent from the subsequent description and claims taken in conjunction with the accompanying drawings.

BRIEF DESCRIPTION OF THE DRAWINGS

Other advantages of the invention will become apparent upon reading the following detailed description and upon reference to the following drawings, in which.

DESCRIPTION OF THE PREFERRED EMBODIMENT

The following description of the preferred embodiment is mainly exemplary in nature and is in no way intended to limit the invention or its application or uses.

Figure 3:
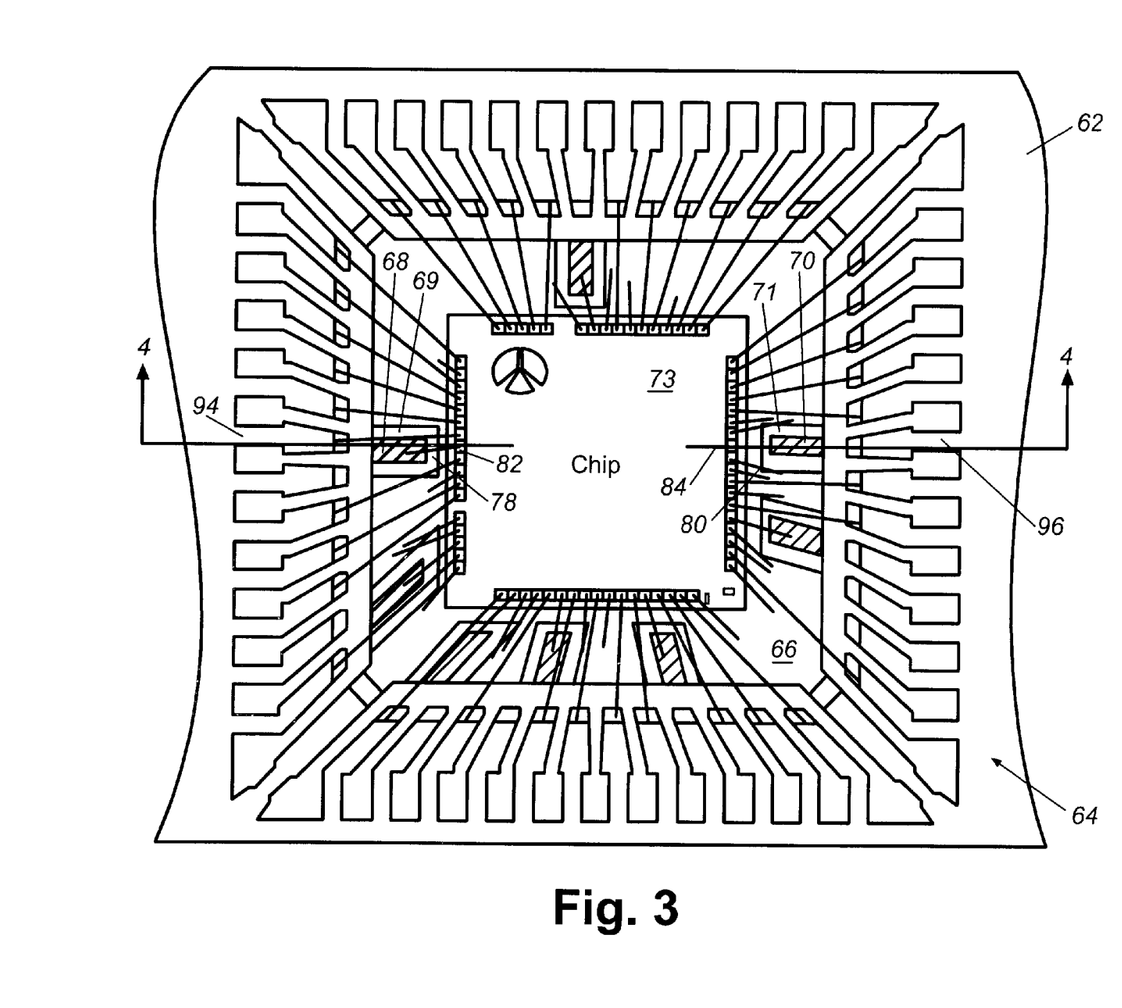
FIG. 3 is a plan view of a leadframe according to a preferred embodiment of the present invention.
Figure 4:
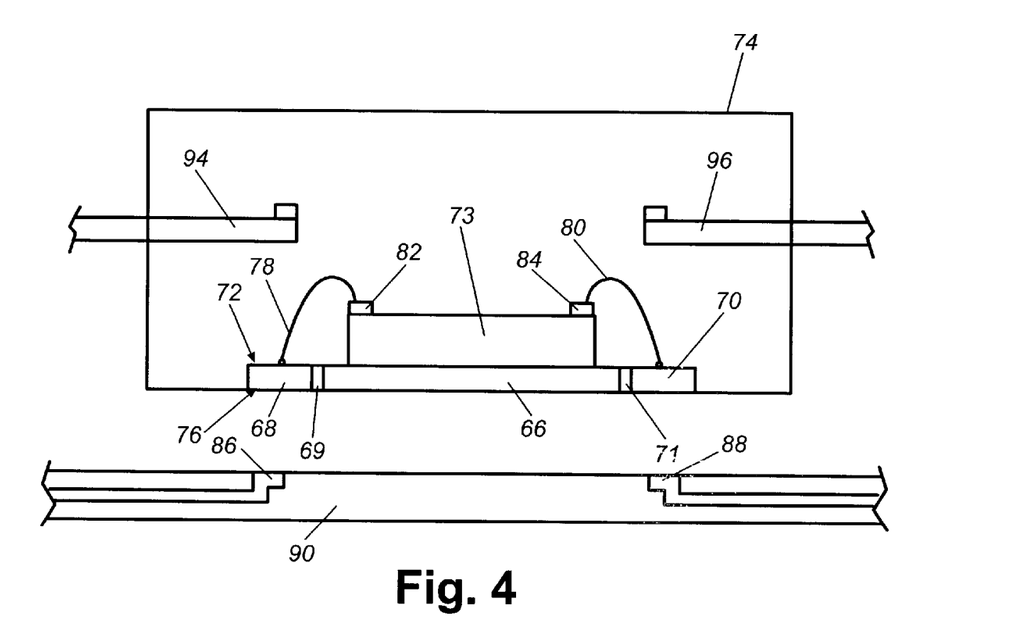
FIG. 4 is a cross-sectional view of the leadframe according to a preferred embodiment of the present invention taken along lines 4–4 of FIG. 3.

A plan view of a leadframe 60 according to a preferred embodiment of the present invention is shown in FIG. 3 and a cross-sectional view of this leadframe 60 taken along lines 4—4 of FIG. 3 is presented in FIG. 4. Referring to FIG. 3 and FIG. 4, it can be seen that the leadframe 60 has a leadframe body 62 that contains a die-mounting structure 64. The die-mounting structure 64 has a square die-pad or paddle area 66 within the leadframe body 62 and the paddle area 66 contains a number of regions 68,70 that are electrically isolated by path gaps 69, 71 (Note: while multiple isolated areas are shown in FIG. 3, references will be limited to two of these regions).

The top side 72 of the paddle area 66 receives a semiconductor device 73 that may be adhesively or metallurgically bonded thereon. Furthermore, when the leadframe is encapsulated in encapsulant material 74, the top side 72 is at least partially enclosed by encapsulant material 74. Path gaps 69 and 71 are also filled with encapsulant material 74. Backside 76 of the paddle area 66 is substantially exposed. Wires 78,80 are connected to the bond pads 82,84 of the semiconductor device 73 and bonded (e.g., down-bonded) to the regions 68,70. In this way, a conductive path is formed with the bond pads 82,84 of the semiconductor device 73, regions 68,70, and bond pads 86,88 of a board 90 when the backside 76 of the paddle area 66 is mated to the board 90.

The bond pads 86,88 of the board 90 may be a power contact, ground contact, or I/O interconnection. Therefore, leads 94,96 of the leadframe 60 may be reduced as previous conductive paths through the leads 94,96 are provided by the electrically isolated regions 68,70 within the paddle area 66. Furthermore, as the distance between the semiconductor device 73 and the paddle area 66 is typically less than the distance from the semiconductor device 73 to the leads 94,96, path inductance is reduced as it is directly proportional to length.

Figure 5:
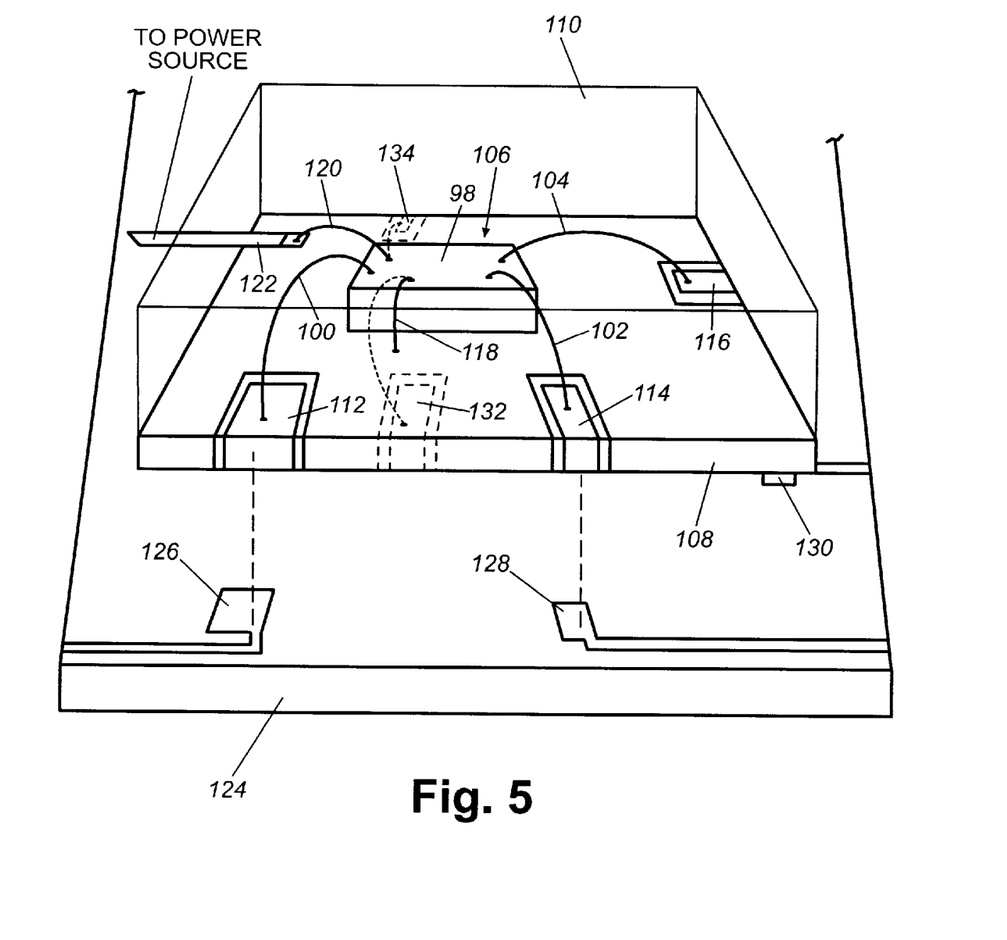
FIG. 5 is semiconductor device that is interconnected to a motherboard through multiple isolated regions within a paddle.

In order to demonstrate the vast applicability of this invention, the following description is presented in conjunction with FIG. 5. As can be seen, a semiconductor device 98 (e.g., Bipolar Junction Transistor (BJT)) having three terminals 100,102,104 (e.g., base, emitter, and collecter) is packaged according to the preferred embodiment of the present invention. The semiconductor device 98 is mounted on the top side 106 of a paddle 108 and at least partially covered with an encapsulant material 110. Each of the three terminals 100,102,104 are connected to one of three isolated regions 112,114,116 within the paddle 108. The device ground terminal 118 is connected to the paddle 108 and the device power terminal 120 is connected to a single lead 122. Therefore, the three terminals 100,102,104 are provided with a conductive path to a board 124 having pads 126,128, 130 for each of the isolated regions 112, 114, 116. Alternatively, two additional isolated regions 132,134 may be provided within the paddle 108 for the device ground terminal 118 and the device power terminal 120. Irrespective, the number of leads is reduced and the connection distances are minimized, thereby reducing package cost, size, and path inductance.

Figure 6:
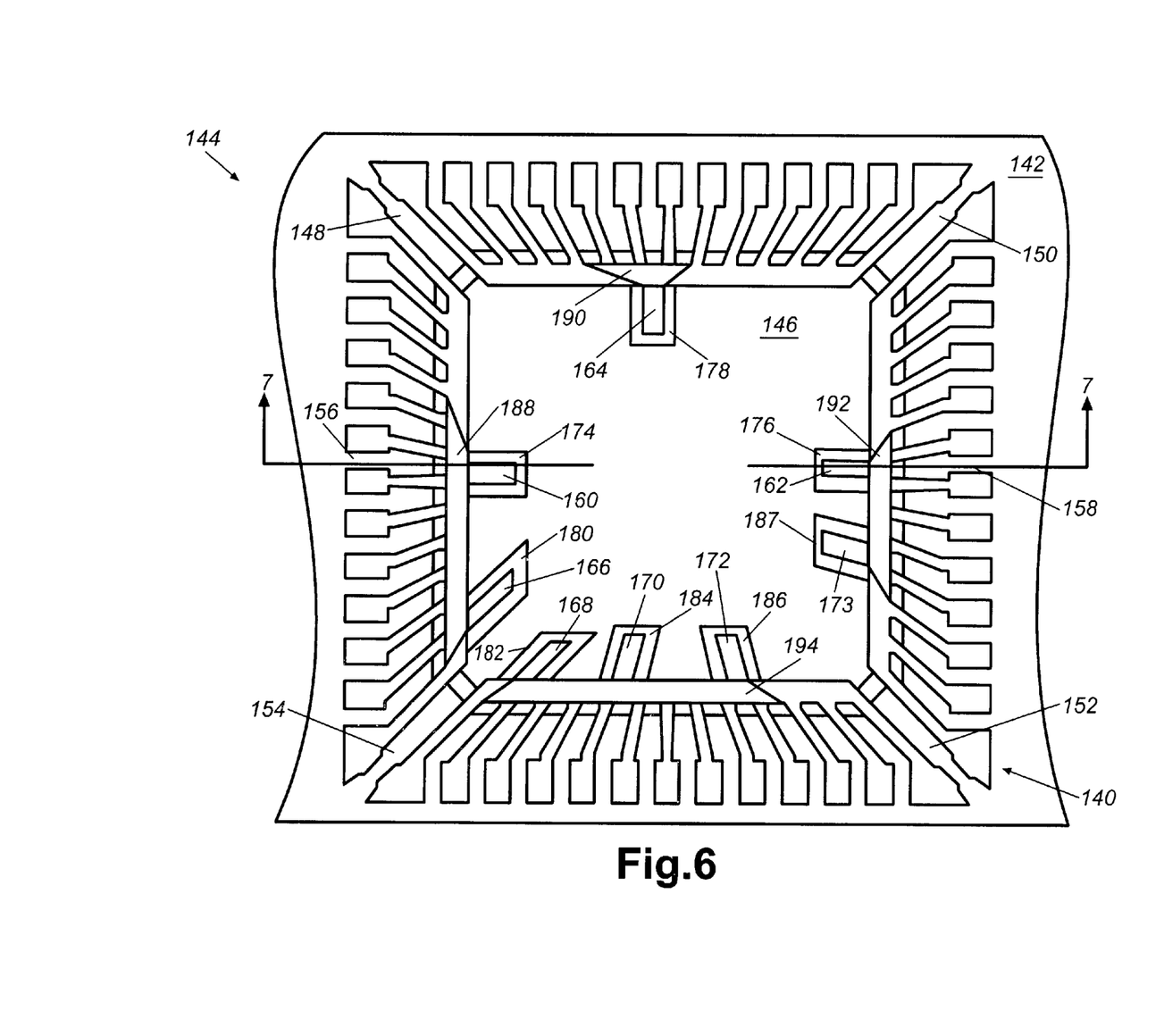
FIG. 6 is a plan view of a leadframe according to a preferred embodiment of the present invention.

In order to produce the leadframe of the preferred embodiment, a unique method of forming an isolated region in a paddle of a leadframe has been developed. Referring to FIG. 6, a die-mounting structure 140 is shown that is contained within a leadframe body 142 of a leadframe 144. Initially, a resist is deposited on the leadframe body 142 in a pattern that defines the basic features of the leadframe 144. These basic features include, but are not limited to, the paddle 146, structural supports 148,150,152,154, and multiple leads 156,158.

In addition to the basic features, a number of isolation regions 160,162,164,166,168,170,172,173 are defined within the paddle 146, path gaps 15 174,176,178,180,182, 184,186,187 are defined around each of the isolated regions 160,612,164,166,168,170,172,173, and a number of support regions 188,190,192,194 are defined within the leadframe 142. Once these patterns have been defined, the leadframe body 142 is etched using known dry etching or wet etching techniques. The base material of the leadframe body 142 is removed such that the basic features remain In addition, the base material is substantially removed from the path gaps 174,176,178,180,182,184,186,187 but remains in the support regions 188,190,192,194 so that the isolation regions 160,162,164,166,168,170,172,173 are connected to the leads and structurally supported. It should be understood that the features may also be created using known punching techniques in which resist deposition is not required.

Once the etching is complete, an adhesive tape (not shown) is applied to the bottom surface of the leadframe body 142 to provide additional structural support. For example, a one-sided adhesive claded tape or polyamide tape may be used. This is followed by disconnecting the support regions from the leads and isolation using known free cutting techniques.

Figure 7:
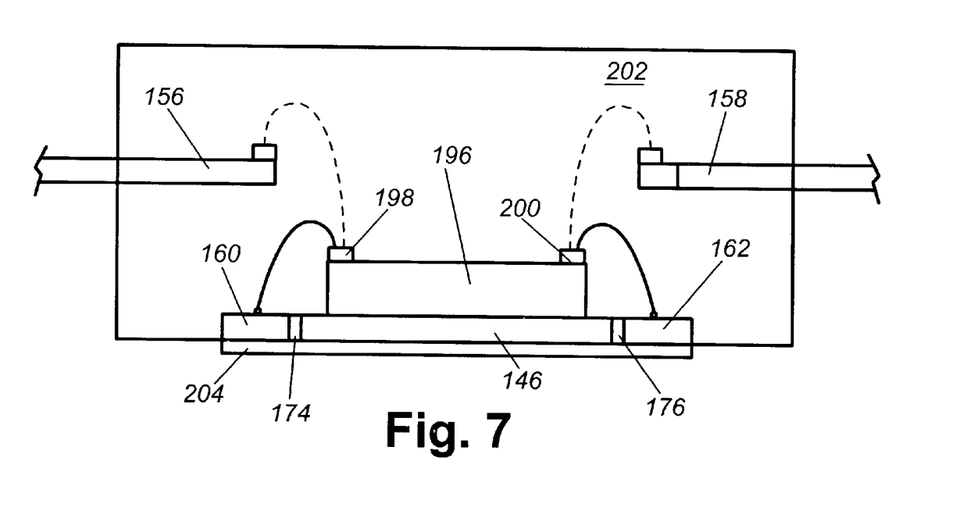
FIG. 7 is a cross-sectional view of the leadframe according to a preferred embodiment of the present invention taken along lines 7—7 of FIG. 6.

Continuing with FIG. 7, once the isolation regions have been separated from the leads, the paddle 146 is deep down-set. It should be noted that deep down-setting is not required, however a deep down-set package is shown in this description. After the leadframe is properly configured, a semiconductor device 196 is adhesively or metallurgically bonded to the paddle 146 and each of the bond pads 198,200 of the device 196 are down-bonded to an isolated region 160,162 or alternatively, bonded to a lead 156,158. This is followed by covering the semiconductor device 196, paddle 146 (including isolation regions 160,162), and portions of the leads 156,158 with an encapsulant material 202. Lastly, as the encapsulant material 202 is supporting the isolation regions 160,162, the adhesive tape 204 may be removed.

An alternate method of forming an isolation region in a paddle leadframe involves laser assisted etching. This is particularly useful for packages having a deep down-set and therefore exposed paddle. While the previously described method involved steps integrated into the basic formation process of a deep down-set package, the alternate method forms the isolation region(s) once the basic formation process is substantially completed. More specifically, once the paddle has been down-set and the encapsulant material is applied, an excimer laser is used to create the path gaps from the exposed side of the paddle (i.e., the excimer laser is directed at the backside of the paddle). As the encapsulant material is present on the front side of the paddle, the isolation regions are structurally supported when the base material is removed by the excimer laser (e.g., an excimer laser having a power setting of 30–50 watts with a pulse width of approximately 20 ns results in an etch rate of about 0.1 microns per pulse).

These methods provide a package that may be surface mounted to a mother board such that selected chip bond pads may be connected to the board bond pads through the isolation regions within the paddle. These isolation regions may provide connections for power contacts, ground contacts, and/or I/O signal connections. Alternatively, the isolation regions may be configured to contain an electrical component.

As previously alluded, inclusion of electrical components within the semiconductor chip may be undesirable. Especially with components that require a significant amount of area within a chip (i.e., inductors). Therefore, if an isolation area within the paddle is configured to contain such a component, an off-chip solution would be provided that does not increase the overall size of the package.

Figure 8:
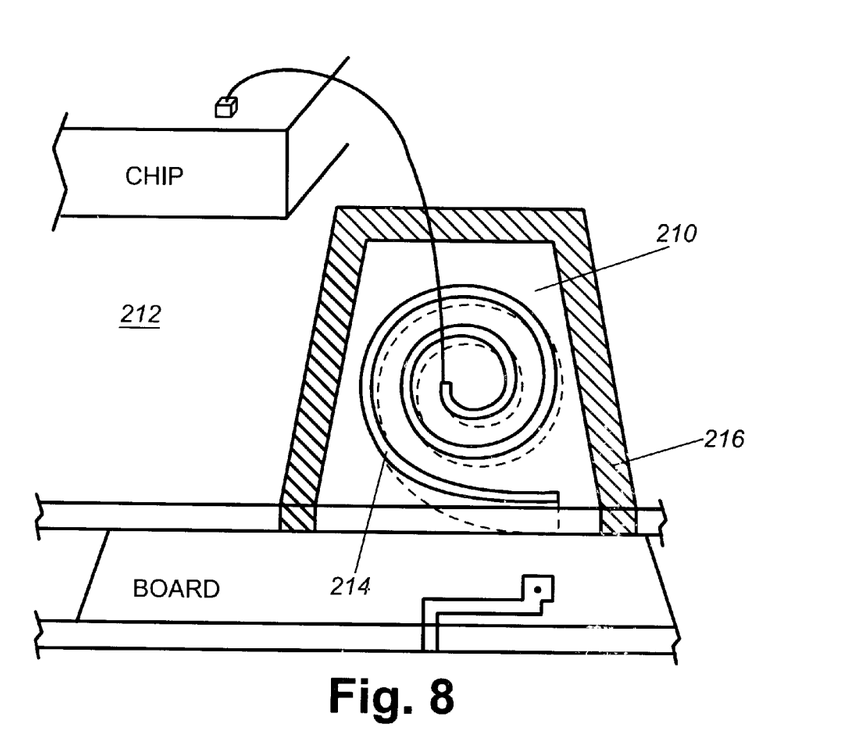
FIG. 8 is plan view of an isolated region of a paddle that contains an off-chip spiral inductor.

As can be seen in FIG. 8, the isolation region 210 created within a paddle 212 could have the form of a spiral inductor 214, and may be realized using the processes previously described. Specifically, the inductor 214 may be attached to the support regions (not shown) to hold the inductor 214 after the creation of a path gap 216. After tape (not shown) is attached the backside of the paddle 212, the support regions may be removed as the tape provides the structural support for the inductor 214. Once an encapsulant material covers the front side of the paddle, the tape may be removed. Alternatively, the package may be formed and the spiral inductor may be etched from the backside using the excimer laser as previously discussed.

In any event, the inductor is isolated from the paddle 212 and formed out of the base material of the paddle 212. Therefore, the inductor 214 thickness corresponds to the thickness of the paddle 212 which is typically 100 to 150 microns. This is 50 to 100 times the thickness of the metal layer previously utilized on the chip and because the leadframe material is often copper, the conductivity is approximately 1.8 times that of aluminum, which is generally used as the metal material in the chip. As this inductor 214 in the paddle 212 has a greater conductivity and a correspondingly higher Q (i.e, Q is directly proportional to the conductivity of the inductor), a high Q inductor is effectively integrated into the package without significantly increasing the overall size of the package.

From the foregoing, it can be seen that a leadframe is provided which reduces the number of leads required for power supply contacts, ground supply contacts, and/or I/O signal connections. Furthermore, path inductance from the semiconductor device to the outside of the package is reduced and an off-chip inductor is produced having a high Q without increasing the overall size of the package.

Those skilled in the art can now appreciate from this description that the broad teachings of the present invention can be implemented in a variety of forms. Therefore, the true scope of the invention is vast, and other modifications will be come apparent to the skilled practitioner upon study of the drawings, specification, and following claims.

What is claimed is:

1. A package for surface mounting a semiconductor device to a board such that a first pad of the semiconductor device is operatively connected to a second pad on the board, comprising:
    a paddle having a front side and a back side, said front side being mated to the semiconductor device and at least partially enclosed in an encapsulant material and said backside being substantially exposed;
    a first region of said paddle that is at least partially isolated by said encapsulant material and aligned with the second pad; and
    an interconnect connected to the first pad of the semiconductor device and bonded to said first region such that a conductive path is formed with the first pad, said first region and the second pad when said backside is mated with the board.

2. The package of claim 1, further comprising a second region of said paddle that is at least partially isolated by said encapsulant material and aligned with a third pad on the board and a second interconnect connected to a fourth pad of the semiconductor device and bonded to said second region such that a second conductive path is formed with said fourth pad, said second region and said third pad when said back side is mated with the board.

3. The package of claim 1, further comprising a second interconnect connected to a third pad of the semiconductor device and bonded to said first region such that a second conductive path is formed with said third pad, said first region and said second pad when said backside is mated with the board.

4. The package of claim 1, wherein said first region contains an electrical component that is operatively connected to the first pad of the semiconductor device and the second pad on the board.

5. The package of claim 4, wherein said electrical component is an inductor.

6. The package of claim 1, wherein said first region is configured to provide a conductive path from said first pad to the second pad that is connected to a power supply.

7. The package of claim 1, wherein said first region is configured to provide a conductive path from said first pad to the second pad that is connected to a ground.

8. The package of claim 1, wherein said first region is configured to provide a conductive path from said first pad to the second pad that is connected to a Input/Output connection.

9. A leadframe for a semiconductor device, comprising:
    a leadframe body;
    a paddle area within said leadframe body for mounting the semiconductor device thereon; and
    an electrically isolated region within said paddle area; wherein
    said paddle area has a front side and a back side, said front side being mated to the semiconductor device and said back side being at least partially exposed; and further wherein, said back side of said paddle is mounted on a motherboard and said electrically isolated region is configured to provide a conductive path to a power supply contact of said motherboard.

10. A leadframe for a semiconductor device, comprising:

a leadframe body;

a paddle area within said leadframe body for mounting the semiconductor device thereon; and an electrically isolated region within said paddle area; wherein said paddle area has a front side and a back side, said front side being mated to the semiconductor device and said back side being at least partially exposed; and further wherein, said back side of said paddle is mounted on a motherboard and said electrically isolated region is configured to provide a conductive path to a ground contact of said motherboard.

11. A leadframe for a semiconductor device, comprising:

a leadframe body;

a paddle area within said leadframe body for mounting the semiconductor device thereon; and an electrically isolated region within said paddle area; wherein said paddle area has a front side and a back side, said front side being mated to the semiconductor device and said back side being at least partially exposed; and further wherein, said back side of said paddle is mounted on a motherboard and said electrically isolated region is configured to provide a conductive path to an Input/Output connection contact of said motherboard.

* * * * *